United States Patent
Wu

(10) Patent No.: US 8,520,369 B2
(45) Date of Patent: Aug. 27, 2013

(54) METHOD AND PROTECTING APPARATUS FOR DISASSEMBLING ELECTRONIC DEVICE

(75) Inventor: Yi-Fang Wu, Taipei-Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 439 days.

(21) Appl. No.: 12/938,508

(22) Filed: Nov. 3, 2010

(65) Prior Publication Data
US 2011/0222215 A1    Sep. 15, 2011

(30) Foreign Application Priority Data
Mar. 11, 2010   (CN) .......................... 2010 1 0121769

(51) Int. Cl.
*H05K 5/00* (2006.01)
*H05K 7/00* (2006.01)
*G06F 1/16* (2006.01)

(52) U.S. Cl.
USPC ............. 361/679.01; 361/679.02; 361/679.3; 361/679.56

(58) Field of Classification Search
USPC ................ 361/679.01, 679.02, 679.56, 679.3
See application file for complete search history.

(56) References Cited

U.S. PATENT DOCUMENTS

| | | | |
|---|---|---|---|
| 6,975,842 B2 * | 12/2005 | Chen | 455/90.3 |
| 7,274,554 B2 * | 9/2007 | Kang et al. | 361/679.01 |
| 7,476,462 B2 * | 1/2009 | Song et al. | 429/97 |

* cited by examiner

*Primary Examiner* — Anthony Haughton
(74) *Attorney, Agent, or Firm* — Altis Law Group, Inc.

(57) ABSTRACT

The disclosure provides an electronic device assembly, a method for disassembling an electronic device, and a protecting apparatus. The electronic device assembly includes an electronic device and a protecting portion. The electronic device includes a main body and a cover panel. The main body includes a bottom panel and a side panel extending from the bottom panel. The cover panel is mounted to the two side panels. The cover panel includes an elastic securing piece elastically abutting an inner surface of the side panel. The protecting portion contacts an outer surface of the side panel to prevent the elastic securing piece from scratching the outer surface when the elastic securing piece moves out of the main body.

15 Claims, 6 Drawing Sheets

METHOD AND PROTECTING APPARATUS FOR DISASSEMBLING ELECTRONIC DEVICE

BACKGROUND

1. Technical Field

The present disclosure relates to methods, and protecting apparatuses for disassembling electronic devices.

2. Description of Related Art

An electronic device usually includes a main body and a cover panel mounted to the main body. The cover panel includes a plurality of securing portions engaging the inner surface of the main body. A conventional method to disassemble a cover panel from a main body is fixing the main body and separating the cover panel from the main body by hand, increasing the risk of the cover panel being scratched the outer surface of the main body.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
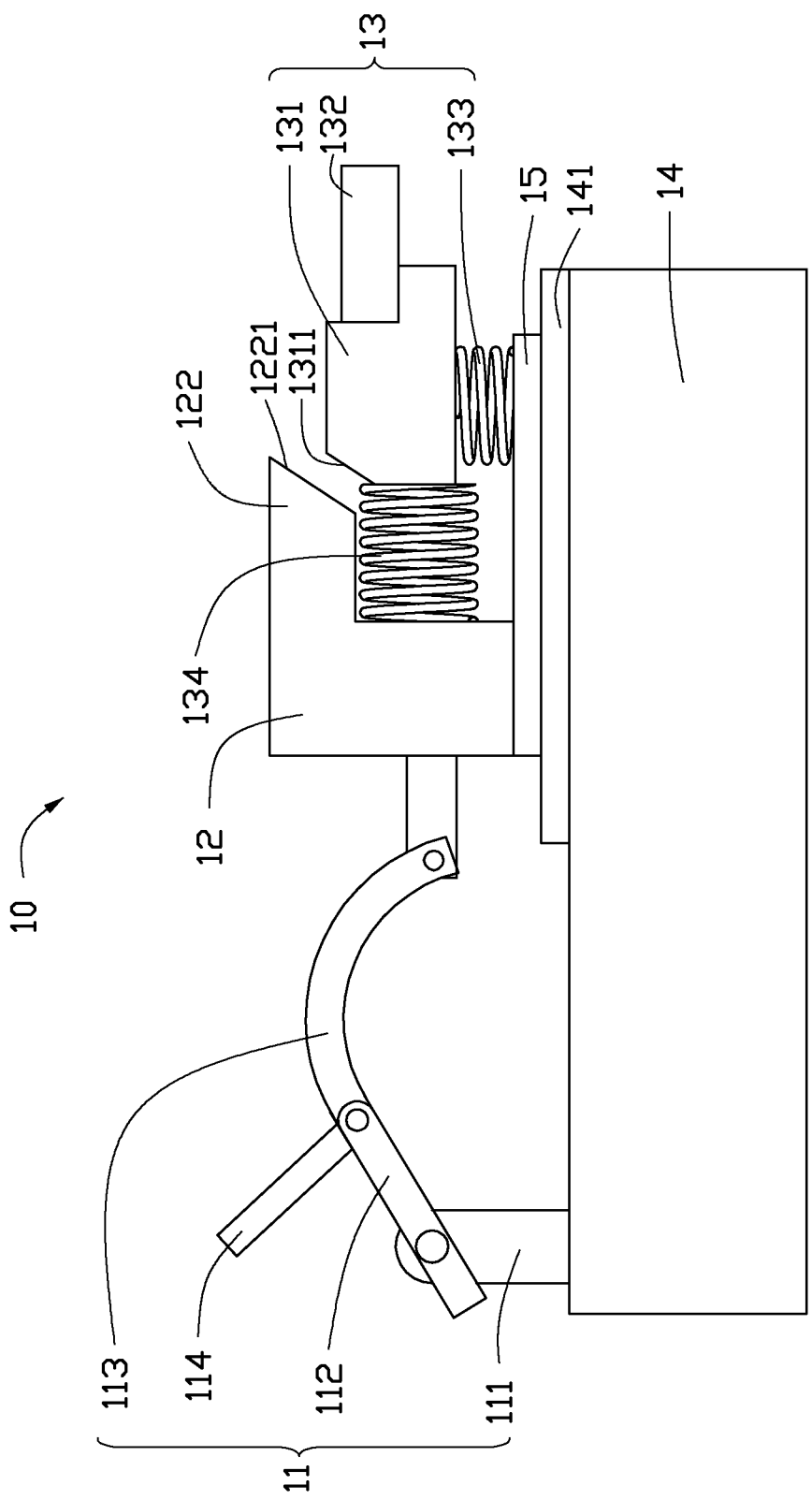
FIG. 1 is a schematic view of a protecting apparatus of an embodiment, the protecting apparatus including a protecting part and an adjusting part, the protecting part including a driven portion, a protecting portion, and an elastic element.
Figure 2:
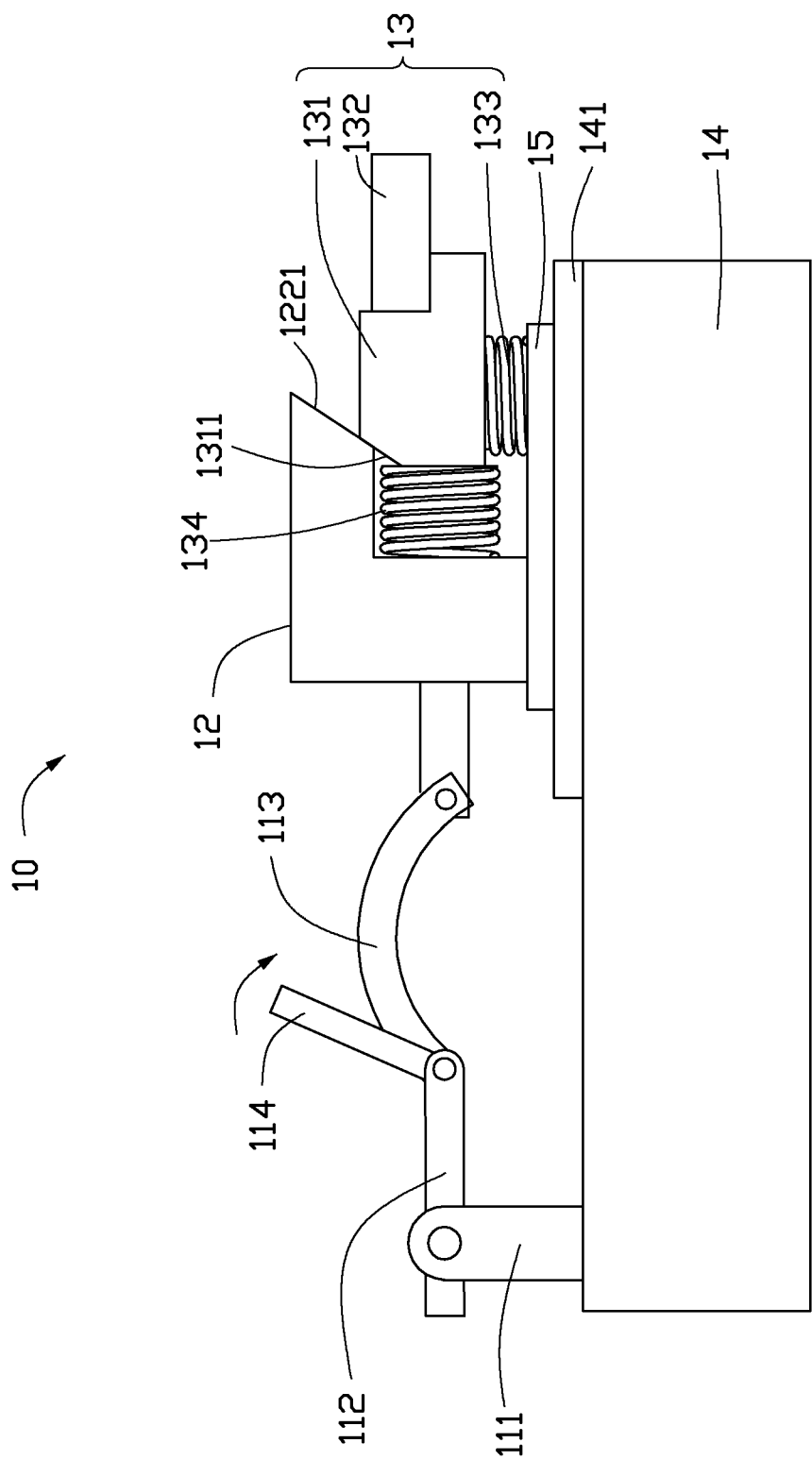
FIG. 2 is similar to FIG. 1, the protecting apparatus being in a using state.
Figure 3:
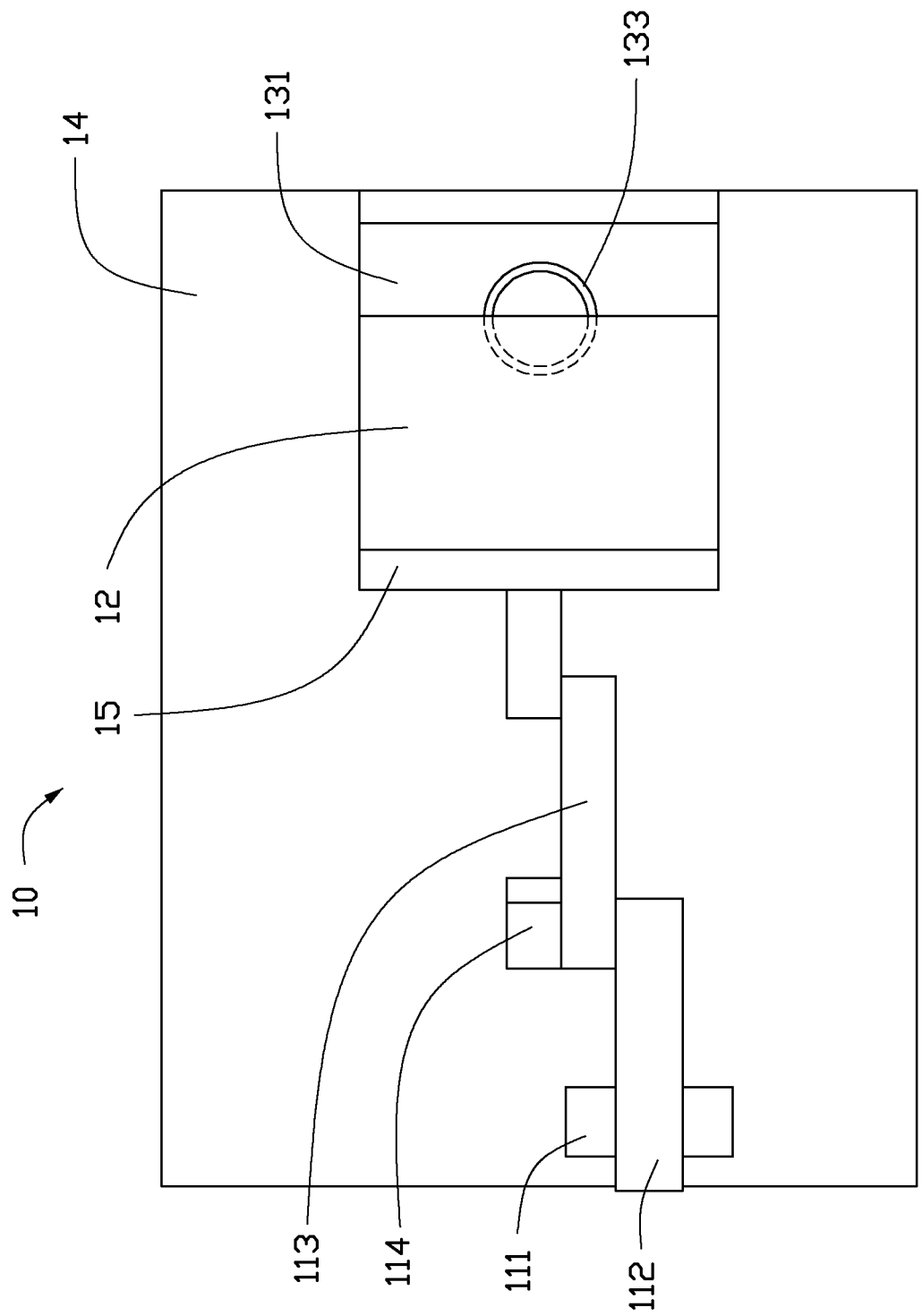
FIG. 3 is a top view of the protecting apparatus of FIG. 2, the protecting apparatus without the driven portion and the protecting portion.
Figure 4:
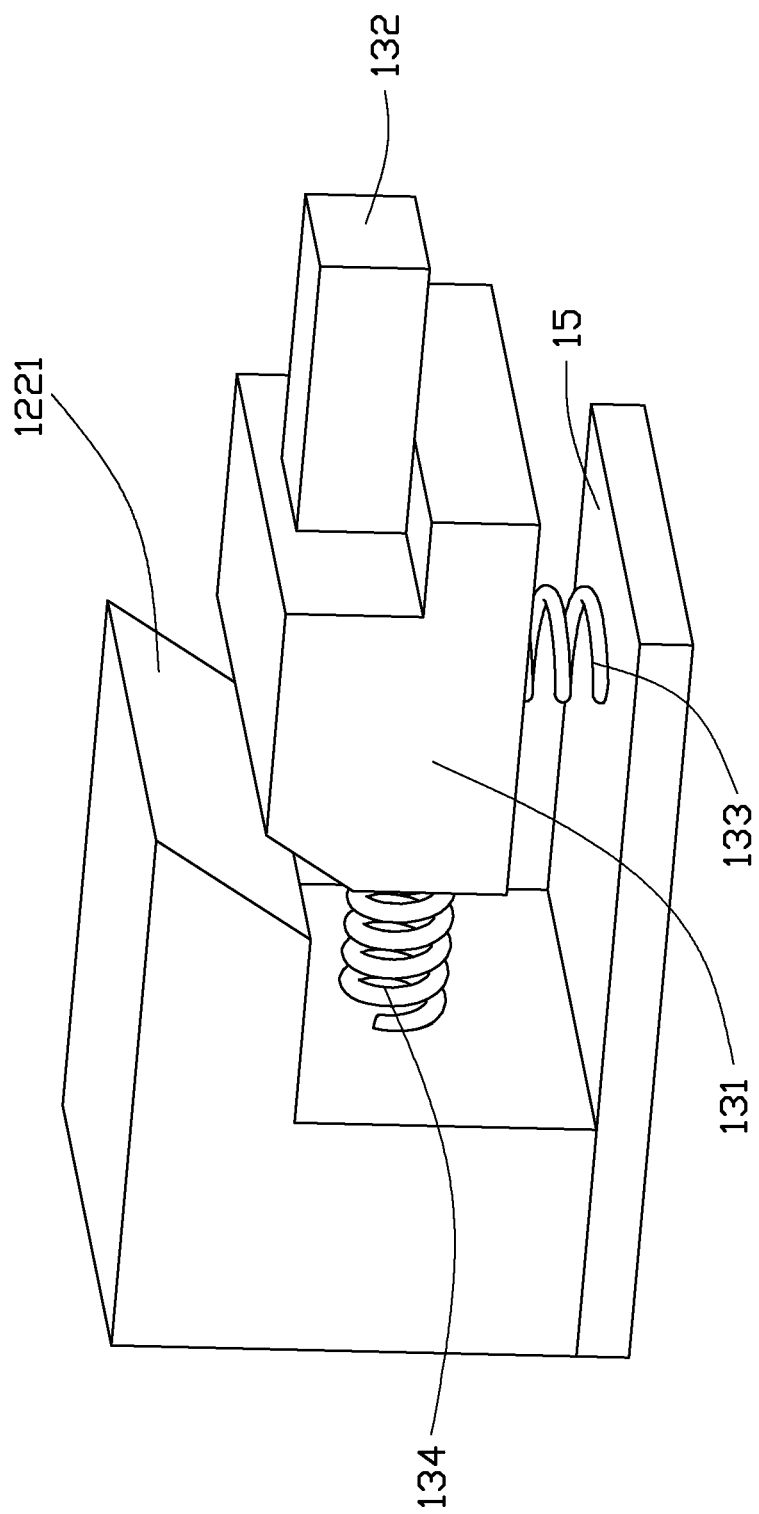
FIG. 4 is an isometric view of the protecting part and the adjusting part of FIG. 1, the protecting apparatus without the driven portion and the protecting portion.
Figure 5:
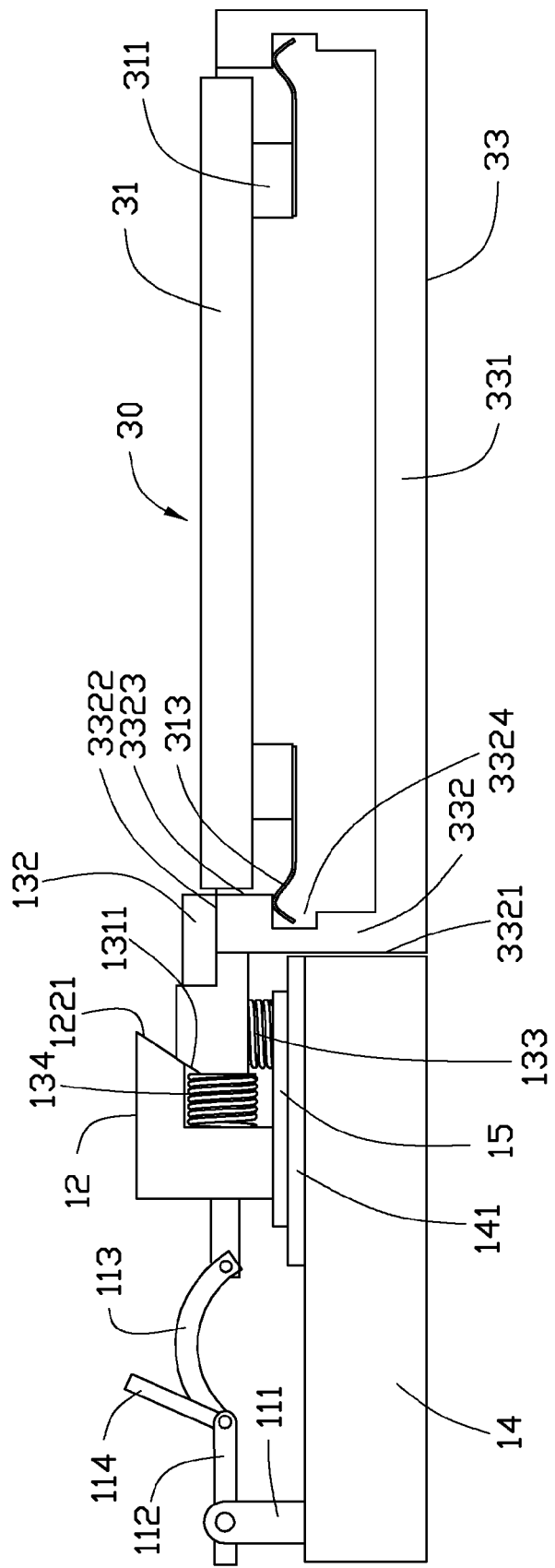
FIG. 5 is a schematic view of the protecting apparatus of FIG. 1 and an electronic device.

Referring to FIGS. 1 through 5, a protecting apparatus 10 is used for protecting an electronic device 30 from being scratched.

The electronic device 30 includes a cover panel 31 and a main body 33. The cover panel 31 includes two securing portion 311. Each securing portion 311 includes an elastic securing piece 313. The main body 33 includes a bottom panel 331 and two side panels 332 perpendicularly extending from the bottom panel 331. Each side panel 332 defines an outer surface 3321 perpendicular to the bottom panel 331, an outer surface 3322 parallel to the bottom panel 331, and an inner surface 3323. A cutout 3324 is defined in each inner surface 3323. The two cutouts 3324 are used for respectively engaging the two elastic securing pieces 313.

The protecting apparatus 10 includes a driving part 11, an adjusting part 12 connected to the driving part 11, a protecting part 13, a base portion 15, and a base 14 supporting the driving part 11 and the base portion 15. The adjusting part 12 is mounted on the base portion 15 and is capable of moving relative to the base portion 15.

The driving part 11 includes a mounting portion 111 secured on the base 14, a moving portion 112 pivotably connected to the mounting portion 111, a pushing portion 113, and a handling portion 114. The pushing portion 113 is pivotably connected to the moving portion 112 and the adjusting part 12. The handling portion 114 is mounted to the moving portion 112. In an embodiment, the pushing portion 113 is an arc-shaped shaft.

The adjusting part 12 includes a pressing portion 122. The pressing portion 122 defines a first inclining surface 1221.

The protecting part 13 includes a driven portion 131, a protecting portion 132 configured to cover the outer surface 3322 of the main body 33, and an elastic element 133. The elastic element 133 is connected to the base portion 15, and the driven portion 131 is connected to the elastic element 133. The driven portion 131 defines a second inclining surface 1311 corresponding to the first inclining surface 1221 of the pressing portion 122. The pressing portion 122 of the adjusting part 12 is capable of delivering force to the second inclining surface 1311 of the driven portion 131 from the first inclining surface 1221. An elastic element 134 is connected between the adjusting part 12 and the driven portion 131. In one embodiment, the elastic elements 133 and 134 are springs, and the protecting portion 132 is a metal piece.

The base 14 includes a sliding rail 141. The base portion 15 of the adjusting part 12 is slidably mounted on the sliding rail 141. The driving part 11 is used for driving the adjusting part 12 to move to the protecting part 13 to cover the outer surface 3322 of the main body 33.

Figure 6:
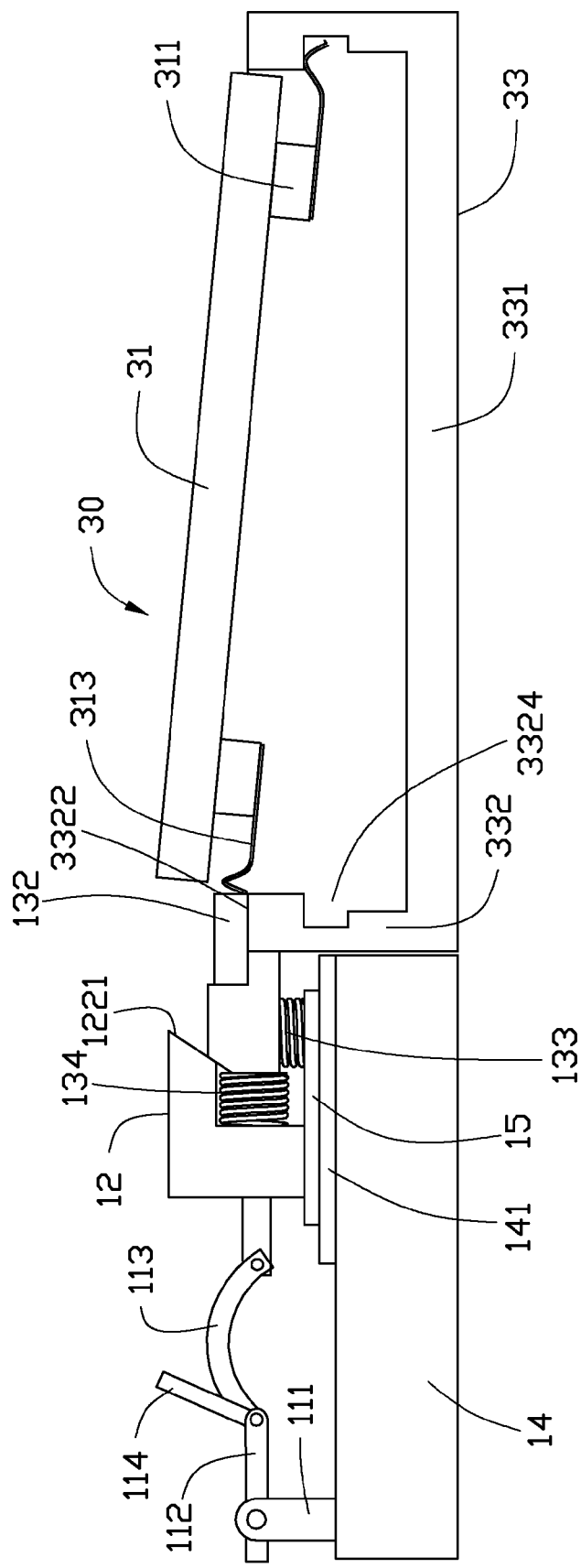
FIG. 6 is another schematic view of the protecting apparatus of FIG. 1 and an electronic device, the electronic device being open.

Referring to FIGS. 1 through 6, the working principle of the protecting apparatus 10 to protect the electronic device 20 when the electronic device 20 is disassembled is described below.

The handling portion 114 is pushed towards the adjusting part 12 to drive the moving portion 112 to pivot clockwise, thereby driving the pushing portion 113 to push the adjusting part 12 to move towards the electronic device 30. The base portion 15 slides towards the electronic device 30. There is a relative movement between the adjusting part 12 and the base portion 15. At the same time, the elastic element 134 is compressed. When the first inclining surface 1221 contacts the second inclining surface 1311, the first inclining surface 1221 of the adjusting part 12 presses the second inclining surface 1311 of the driven portion 131, which makes the driven portion 131 move downward. The driven portion 131 moves forward and downward to enable the protecting portion 132 to contact the outer surface 3322 of the electronic device 30. At this time, the elastic element 133 is compressed, and the protecting portion 132 is adjacent to the inner surface 3323 of the electronic device 30.

During the process that the cover panel 31 is separated from the main body 33, one side of the cover panel 31 is pulled up, and the elastic securing piece 313 disengages the corresponding cutout 3324, and the elastic securing piece 313 resists elastically against the inner surface 3323 of the main body 33. When the side of the cover panel 31 is pulled up continually, the elastic securing piece 313 moves out of the main body 32 and resists elastically on the protecting portion 132, which prevents the elastic securing piece 313 from scratching the outer surface 3322 of the main body 32.

The handling portion 114 is pulled back to make the first inclining surface 1221 separate from the second inclining surface 1311. At this time, the elastic element 133 recovers and makes the driven portion 131 move up, which enables the protecting portion 132 to be detached from the outer surface of the main body 32. The driven portion 131 is driven to move back when the handling portion 114 is pulled back continually.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device assembly comprising:
   an electronic device, the electronic device comprising a main body and a cover panel, the main body comprising a bottom panel, and a side panel extending from the bottom panel, the cover panel mounted to the side panel; the cover panel comprising an elastic securing piece elastically abutting an inner surface of the side panel; and
   a protecting apparatus located out of the electronic device, the protecting apparatus comprising an adjusting part, a protecting part, and a base; the adjusting part and the protecting part mounted on the base; the protecting part comprising a driven portion and a protecting portion connected to the driven portion; the adjusting part configured to move relative to the base to push the driven portion to drive the protecting portion to move to contact an outer surface of the side panel, thereby preventing the elastic securing piece from scratching the outer surface when the elastic securing piece moves out of the main body.

2. The electronic device assembly of claim 1, wherein the outer surface comprises a first outer surface parallel to the bottom panel and a second outer surface perpendicular to the bottom panel, the first outer surface adjacent to the inner surface, the protecting portion configured to contact and fully covering the first outer surface.

3. The electronic device assembly of claim 1, wherein a cutout is defined in the inner surface of the side panel for engaging the elastic securing piece.

4. The electronic device assembly of claim 1, wherein the protecting apparatus further comprises a driving part connected to the adjusting part and mounted on the base, the driving part configured to push the adjusting part to press the protecting part, thereby enabling the protecting portion to contact the outer surface.

5. The electronic device assembly of claim 4, wherein the protecting part further comprises a first elastic element; the protecting apparatus comprises a base portion slidably mounted to the base, and the adjusting part is mounted on the base portion and capable of moving relative to the base portion; the adjusting part further comprises a pressing portion, the first elastic element is located between the driven portion and the base portion in a vertical direction perpendicular to the base portion, the pressing portion configured to press the driven portion to move forward and downward, thereby driving the protecting portion to contact the outer surface when the adjusting part is pushed by the driving part.

6. The electronic device assembly of claim 5, wherein the pressing portion defines a first inclining surface, and the driven portion defines a second inclining surface corresponding to the second inclining surface, the pressing portion configured to press the second inclining surface via the first inclining surface.

7. The electronic device assembly of claim 5, wherein a second elastic element is connected to the driven portion and the adjusting part.

8. The electronic device assembly of claim 4, wherein the driving part comprises a mounting portion secured to the base, a moving portion pivotably mounted to the mounting portion, a pushing portion, and a handling portion; wherein the pushing portion is pivotably connected to the moving portion and the adjusting part, the handling portion is connected to the moving portion, and the adjusting part is configured to be pushed to move by operating the handling portion.

9. The electronic device assembly of claim 8, wherein the pushing portion is an arc-shaped shank.

10. A protecting apparatus for protecting an electronic device, wherein the electronic device comprising a main body and a cover panel, the main body comprising a bottom panel and a side panel extending from the bottom panel, the cover panel mounted to the side panel; the cover panel comprising an elastic securing piece elastically resisting against an inner surface of the side panel, the protecting apparatus comprising:
    a protecting part, the protecting part comprising a driven portion and a protecting portion connected to the driven portion;
    an adjusting part; and
    a base, the adjusting part and the protecting part mounted on the base;
    wherein the adjusting part is configured to move relative to the base to push the driven portion to drive the protecting portion to move to contact contacting an outer surface of the side panel, thereby preventing the elastic securing piece from scratching the outer surface when the elastic securing piece moves out of the main body.

11. The protecting apparatus of claim 10, wherein the protecting apparatus further comprises a driving part connected to the adjusting part and mounted on the base, the driving part configured to push the adjusting part to press the protecting part, thereby enabling the protecting portion to contact the outer surface.

12. The protecting apparatus of claim 11, wherein the protecting part further comprises a first elastic element; a base portion is slidably mounted to the base , and the adjusting part is mounted on the base portion and capable of moving relative to the base portion; the adjusting part further comprises a pressing portion mounted on the base portion, the first elastic element is located between the driven portion and the base portion in a vertical direction perpendicular to the base portion, the pressing portion configured to press the driven portion to move forward and downward, thereby driving the protecting portion to contact the outer surface when the adjusting part is pushed by the driving part.

13. The protecting apparatus of claim 12, wherein the pressing portion defines a first inclining surface, and the driven portion defines a second inclining surface corresponding to the second inclining surface, the pressing portion configured to press the second inclining surface via the first inclining surface.

14. The protecting apparatus of claim 12, wherein a second elastic element is connected to the driven portion and the adjusting part.

15. The protecting apparatus of claim 11, wherein the driving part comprises a mounting portion secured to the base, a moving portion pivotably mounted to the mounting portion, a pushing portion, and a handling portion; wherein the pushing portion is pivotably connected to the moving portion and the adjusting part, the handling portion is connected to the moving portion, and the adjusting part is configured to be pushed to move by operating the handling portion.

* * * * *